(12) United States Patent
Grasmueller et al.

(10) Patent No.: US 6,296,108 B1
(45) Date of Patent: Oct. 2, 2001

(54) METHOD AND APPARATUS FOR DELIVERING COMPONENTS ON A COMPARTMENTED BELT

(75) Inventors: Hans-Horst Grasmueller, Mammendorf; Harald Stanzl, Munich, both of (DE)

(73) Assignee: Siemens Production and Logistics System AG, Nuremberg (DE)

( * ) Notice: Subject to any disclaimer, the term of this patent is extended or adjusted under 35 U.S.C. 154(b) by 0 days.

(21) Appl. No.: 09/197,956

(22) Filed: Nov. 20, 1998

(30) Foreign Application Priority Data

Sep. 29, 1998 (DE) ................................. 198 44 662

(51) Int. Cl.⁷ ................................................. B65G 25/04
(52) U.S. Cl. .............................. 198/631.1; 414/411
(58) Field of Search .................... 198/456, 631.1; 414/411, 810

(56) References Cited

U.S. PATENT DOCUMENTS

| | | | |
|---|---|---|---|
| 4,995,157 | 2/1991 | Hall | 29/740 |
| 5,099,522 | 3/1992 | Morimoto | 382/8 |
| 5,310,301 | * 5/1994 | Aono | 414/411 X |
| 5,667,129 | 9/1997 | Morita et al. | 228/102 |
| 5,927,469 | * 7/1999 | Dunifon et al. | 198/456 |
| 6,082,428 | * 7/2000 | Ando et al. | 414/411 X |

FOREIGN PATENT DOCUMENTS

| | | |
|---|---|---|
| 36 07 242 A1 | 9/1987 | (DE) . |
| 0 589 276 | 3/1994 | (EP) . |
| 0 589 276 B1 | 3/1994 | (EP) . |
| 0 817 560 A2 | 1/1998 | (EP) . |

\* cited by examiner

Primary Examiner—Janice L. Krizek
(74) Attorney, Agent, or Firm—Schiff Hardin & Waite

(57) ABSTRACT

A configuration for positioning components within the compartments on a delivery belt prior to their removal by an onserting apparatus. The configuration can include a brush and a vibrator.

11 Claims, 2 Drawing Sheets

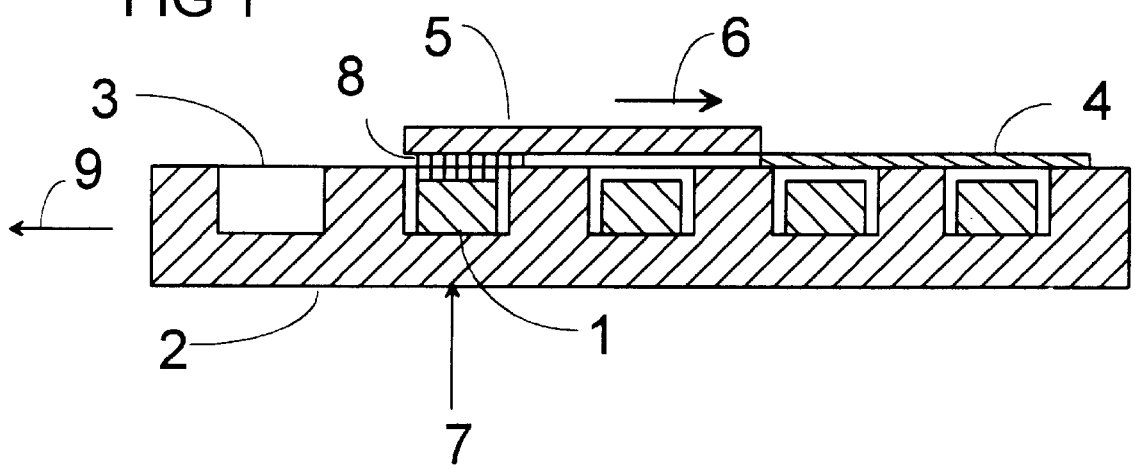
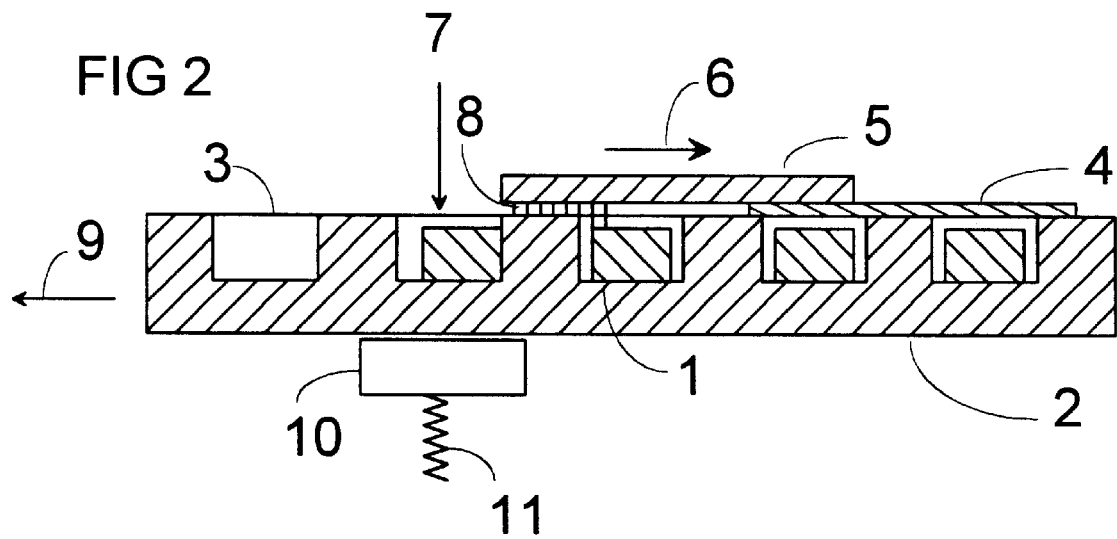

METHOD AND APPARATUS FOR DELIVERING COMPONENTS ON A COMPARTMENTED BELT

BACKGROUND OF THE INVENTION

The invention is directed to a method and to an apparatus for delivering components on a belt to an onserting machine.

In the automatic equipping (onserting) of printed circuit boards with surface-mountable components, what are referred to as SMD (surface mounted device) components, the SMD components are presented in the form of belted components, i.e, on belts. The form of delivery on a belt is particularly susceptible to automation since the components are already detached and the packaging in the belt assures far-reaching security against mistaken identity. In the individual delivery devices for belted components, the belts with the components are unwound from a belt reel and then supplied to a removal position for the components. In this removal position, the components are then picked up with the suction pipette of an onserting head and are then positioned in a predetermined onserting position on a printed circuit board. The cover foils of the belts that prevent the components from falling out of the component compartments of the belts are pulled off before the removal position is reached.

EP 0 589 276 discloses a delivery means for belted SMD components that comprises a movable covering of the component compartments in the removal region. This covering is moved synchronously with the belt in the unwinding direction of the belt until the front component compartment has reached the removal position. Subsequently, the covering is moved in the opposite direction for releasing the front component compartment. As a result of the movable covering, the SMD components are covered during transport in the removal region of a belt i.e. the components are prevented from jumping up or out of the component compartments.

It is felt to be a disadvantage, particularly given small components, that the components are fashioned smaller than the component compartments that accept them. Normally, the suction pipette anticipates the component in the middle of the component compartment in the removal position. Given large components (having an area of approximately 1 $mm^2$), the precision of the positions of the components in the component compartments are not critical, since the lifting surface of the suction pipette is generally fashioned smaller than the component and therefore lands at least approximately in the middle of the surface of the component. Given small components (an area smaller than approximately 1 $mm^2$), the lifting surface of the suction pipettes is partially larger than the components themselves. This so-called pipette projection then limits the packing density on the substrate to be equipped.

The foregoing gives rise to the concept of the "onserting shadow" or "equipping shadow". Given smaller components whose actual position in the component compartment deviates from the anticipated position in the middle of the component compartment, it can occur that the components are not correctly picked up and losses of time, among other things, are caused by mispositioned picking up new components, or damage can also occur when an incorrectly lifted component drops from the suction pipette into the automatic equipping unit during transport.

SUMMARY OF THE INVENTION

It is an object of the invention to provide a method and an apparatus that assures a reliable fetching of small components in belts.

To that end, in an embodiment, the invention provides a method comprising the steps of:

conveying the components to a removal position in component compartments of a belt;

holding the components in the component compartments with the assistance of a covering that is allocated to the removal position;

releasing each component compartment in the removal position with the covering; and moving a component into a predetermined position within the component compartment prior to removal of the component.

Similarly, the invention provides an apparatus for delivery of belted components to an onserting apparatus, comprising a movable covering for component compartments of a belt that is allocated to a removal position, the covering comprising means for moving the component into a predetermined position in the component compartment.

Advantageously, the moveable covering comprises means with which the component is moved into a predetermined, exactly defined position, for example a corner of the component compartment.

In a preferred embodiment, the invention provides that the movement of the covering itself is used in order to move the component into the predetermined position. Complicated, additional designs are thus eliminated.

In another preferred embodiment of the invention, a brush allocated to the covering is employed in order to push the component into the predetermined position. A brush can be attached to the covering in a simple way.

In yet a further preferred embodiment of the invention, a suction tube is used in order to move the component into a predetermined position by suctioning air or by blowing. As a result thereof, the component can likewise be brought into the predetermined position without moving the covering.

In another embodiment of the invention, a vibration means is provided so that the friction of the component in the component compartment is reduced and, thus, the movement is facilitated.

These and other features of the invention are discussed in greater detail below in the following detailed description of the presently preferred embodiments with reference to the accompanying drawings.

BRIEF DESCRIPTION OF THE DRAWINGS

FIG. 1 illustrates a schematic cross-section of a component belt with closed covering having a brush;

FIG. 2 illustrates a schematic cross-section of a component belt with free removal position and a covering with a brush;

DETAILED DESCRIPTION OF THE PRESENTLY PREFERRED EMBODIMENTS

Figure 3:
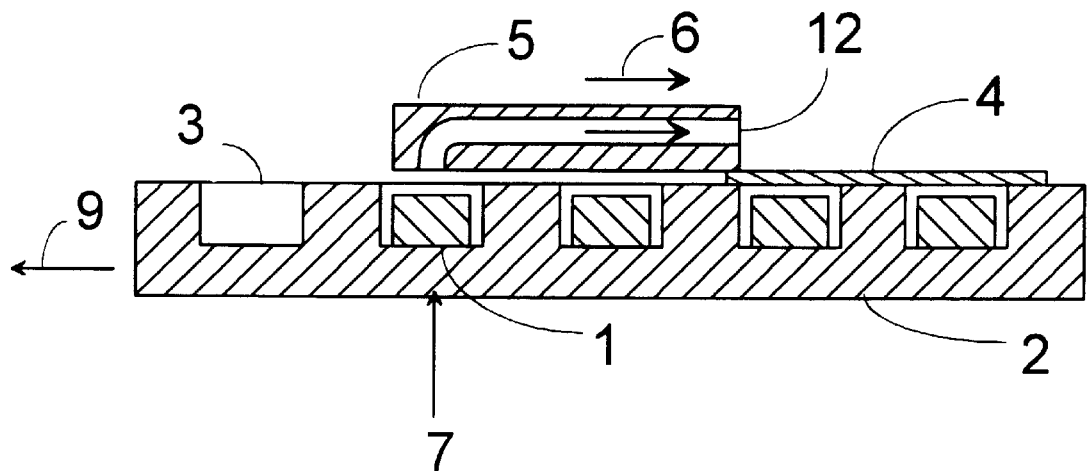
FIG. 3 illustrates a schematic cross-section of a component belt with a suction tube in the covering.

In a cross-section, FIG. 1 shows a plurality of components 1 carried in a component belt 2 moved by a suitable converter means, whereby the components 1 lie in component compartments 3 matched to their dimensions. The component compartments 3 are closed by a covering foil 4 that is pulled off from the belt moved in a direction 9, being pulled off preceding the removal position 7 by a means (not shown). So that the components 1 do not fall out of the component compartments 3 or tilt in the component compartment 3, a movable covering 5 is provided in the region of the removal position 7 that, before the removal of the component 1 with the suction pipette (not shown) of the automatic onserting unit, is moved in a moving direction 6 and thus releases the component compartment 3 in the removal position 7.

Figure 4A:
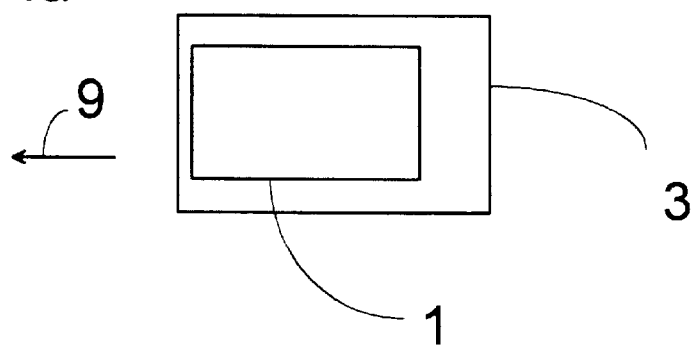
FIG. 4a illustrates a schematic plan view of a component lying arbitrarily in a component compartment.

As shown in a schematic plan view in FIG. 4a, the dimensions of the component compartments 3 are larger than the dimensions of the components 1. The components 1 lie freely movable in the component compartments 3. Particularly given small components (area less than approximately 1 mm$^2$ or an edge length less than approximately 0.5 mm), difficulties in fetching the components derive therefrom when the position of the components 1 in the component compartment is unknown. Components that exhibit a positional tolerance greater than 20% of their edge length in the component compartment 3 are also to be considered small since their position is then imprecise. The suction pipette approaches a predetermined position; when the component 1 is not located at this predetermined position, it is not picked up at all or is so poorly picked up that, for example, it is dropped during continued transport. This potentially leads to damage to the machine.

Figure 4B:
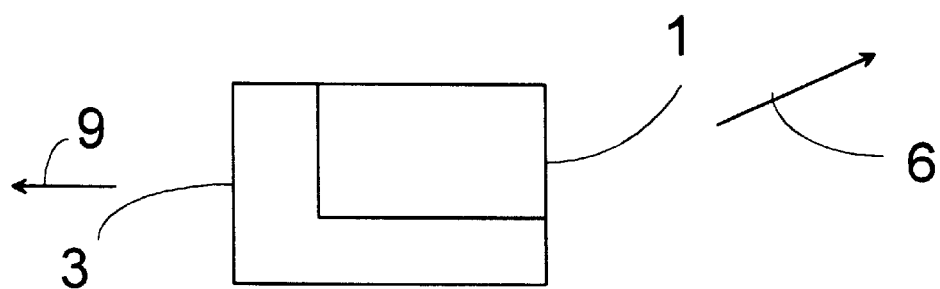
FIG. 4b illustrates a schematic plan view of a component in a predetermined position in the component compartment.

As a result of a brush 8 (shown in FIG. 1) at the covering 5, the component 1 is moved into the predetermined position at the edge of the component compartment shown in FIG. 2. The predetermined position can thereby be the back edge of the component compartment 3 with reference to the conveying direction 9 and can also, for example be one of the back corners of the component compartment 3 with reference to the conveying direction 9, as shown in FIG. 4b. In the corners, the component 1 is held in the predetermined position by two edges of the component compartment 3 residing essentially perpendicularly relative to one another, as a result whereof the predetermined position is more exactly defined. The moving direction 6 required therefor can be realized, for example, by an appropriate moving direction 6 of the covering 5 with a brush stroke provided therefor.

For reducing the friction of the component 1 in the component compartments 3, a vibratory means 11 (for example, a piezo-oscillator) is provided in the component compartments 3 in FIG. 2, this vibratory means 11 placing the component belt into vibration via an abutment 10 for the bearing of the component belt 2. As a result thereof, the components 1 can be more easily moved to the back edge of the component compartment 3.

FIG. 3 shows a further embodiment in cross-section wherein a suction tube 12 is arranged in the covering 5. Air is drawn in through the suction tube and the air stream—dependent on the position of the suction tube—pulls the component 1 against the back edge or into one of the back corners of the component compartment 3. Air streaming from the tube through holes arranged at the opposite sides of the covering 5 also allows the component 1 to be moved into the predetermined position on the basis of the air stream. In this embodiment, the covering 5 need not be moved in order to bring the component 1 into the predetermined position; however, an embodiment with air stream given simultaneous movement of the covering 5 is also possible.

Although modifications and changes may be suggested by those skilled in the art, it is the intention of the inventors to embody within the patent warranted hereon all changes and modifications as reasonably and properly come within the scope of their contribution to the art.

What is claimed is:

1. A method for the delivery of belted components to an onserting apparatus, comprising the steps of:
   conveying the components to a removal position in component compartments of a belt;
   holding the components in the component compartments with the assistance of a covering that is located above the removal position;
   releasing each component compartment in the removal position by moving the covering in a moving direction; and
   moving a component into a predetermined position within the component compartment prior to removal of the component;
   wherein the component is moved into the predetermined position in the component compartment by the moving of the covering when the component compartment is in the removal position.

2. A method for the delivery of belted components to an onserting apparatus, comprising the steps of:
   conveying the components to a removal position in component compartments of a belt;
   holding the components in the component compartments with the assistance of a covering that is located above the removal position;
   releasing each component compartment in the removal position by moving the covering in a moving direction;
   moving a component into a predetermined position within the component compartment prior to removal of the component; and
   subjecting the component to vibration during the moving of the component to the predetermined position.

3. A method for the delivery of belted components to an onserting apparatus, comprising the steps of:
   conveying the components to a removal position in component compartments of a belt;
   holding the components in the component compartments with the assistance of a covering that is located above the removal position;
   releasing each component compartment in the removal position by moving the covering in a moving direction; and
   moving a component into a predetermined position within the component compartment prior to removal of the component;
   wherein said step of moving a component comprises moving both magnetic and non-magnetic components.

4. A method for the delivery of belted components to an onserting apparatus, comprising the steps of:
   conveying the components to a removal position in component compartments of a belt;
   holding the components in the component compartments with the assistance of a covering that is located above the removal position;
   releasing each component compartment in the removal position by moving the covering in a moving direction; and
   moving a component into a predetermined position within the component compartment prior to removal of the component;
   wherein the predetermined position consists of an x, y position in an x, y plane parallel to a top surface of the component belt and the predetermined position is one in which the component abuts a compartment edge.

5. An apparatus for the delivery of belted components to an onserting apparatus, said delivery apparatus comprising:

a belt having component compartments; and a movable covering located above a removal position, the covering comprising an element for moving a component into a predetermined position in a component compartment.

6. The apparatus for the delivery of belted components according to claim 5, wherein the element of the covering is a suction tube that moves the component into the predetermined position by forming a vacuum in the suction tube.

7. The apparatus for the delivery of belted components according to claim 5, wherein a vibrator is provided that promotes the movement of the component into the predetermined position.

8. The apparatus of claim 5, wherein the element for moving the component can move both magnetic and non-magnetic components.

9. The apparatus of claim 5, wherein the predetermined position consists of an x, y position in an x, y plane parallel to a top surface of the component belt.

10. The apparatus for the delivery of belted components according to claim 5, wherein the component is moved into the predetermined position by the element of the covering when the covering is moved in a moving direction, when the component compartment holding the component is in the removal position.

11. The apparatus for the delivery of belted components according to claim 10, wherein the element of the covering is a brush that pushes the component into the predetermined position.

* * * * *